US009293949B2

(12) United States Patent
Trudnowski et al.

(10) Patent No.: US 9,293,949 B2
(45) Date of Patent: Mar. 22, 2016

(54) ELECTRIC POWER GRID SIGNAL PROCESSING METHODS, OSCILLATORY MODE ESTIMATION METHODS AND MODE SHAPE ESTIMATION METHODS

(75) Inventors: Dan Trudnowski, Butte, MO (US); John Pierre, Laramie, WY (US)

(73) Assignees: Montana Tech of the University of Montana, Butte, MT (US); University of Wyoming, Laramie, WY (US)

( * ) Notice: Subject to any disclaimer, the term of this patent is extended or adjusted under 35 U.S.C. 154(b) by 787 days.

(21) Appl. No.: 13/367,276

(22) Filed: Feb. 6, 2012

(65) Prior Publication Data

US 2013/0204557 A1 Aug. 8, 2013

(51) Int. Cl.
*H02J 13/00* (2006.01)
*G01R 19/25* (2006.01)

(52) U.S. Cl.
CPC ......... *H02J 13/0006* (2013.01); *G01R 19/2513* (2013.01)

(58) Field of Classification Search
CPC ...... H02J 3/24; H02J 13/0006; Y02E 60/728; Y04S 10/265; G01R 19/2513
USPC ............................................ 700/297; 702/60
See application file for complete search history.

(56) References Cited

U.S. PATENT DOCUMENTS

| | | | |
|---|---|---|---|
| 6,476,521 B1 * | 11/2002 | Lof et al. ...................... 307/105 |
| 7,490,013 B2 | 2/2009 | Wells | |
| 7,987,059 B2 | 7/2011 | Gong et al. | |
| 8,471,610 B2 * | 6/2013 | Sun et al. ...................... 327/156 |
| 2005/0187726 A1 | 8/2005 | Korba et al. | |
| 2007/0241759 A1 * | 10/2007 | Williams ...................... 324/600 |
| 2008/0177425 A1 * | 7/2008 | Korba et al. .................. 700/297 |
| 2009/0099798 A1 * | 4/2009 | Gong et al. .................... 702/57 |
| 2009/0222144 A1 * | 9/2009 | Venkatasubramanian et al. ............................. 700/292 |
| 2010/0023179 A1 * | 1/2010 | Korba et al. .................. 700/297 |
| 2012/0123602 A1 * | 5/2012 | Sun et al. ...................... 700/292 |

OTHER PUBLICATIONS

Dosiek et al., "A Channel Matching Approach for Estimating Electromechanical Mode Shape and Coherence", IEEE Power & Energy Society General Meeting Jul. 26-30, 2009, Calgary, Alberta, 8 pages.
Dosiek et al., "New Algorithms for Mode Shape Estimation Using Measured Data", Proceedings of the IEEE Power Engineering Society General Meeting, Jul. 2008, United States; 8 pages.
Dosiek, "Estimating Power System Electromechanical Modes and Mode Shapes Using Modern System Identification Techniques", Ph.D. Dissertation, University of Wyoming, 2010; United States, 235 pages.
Hauer et al., "An Oscillation Detector used in the BPA Power System Disturbance Monitor", IEEE Transaction on Power Systems vol. 5, No. 1, Feb. 1990, United States, pp. 74-79.

(Continued)

*Primary Examiner* — Regis Betsch
(74) *Attorney, Agent, or Firm* — Wells St. John P.S.

(57) ABSTRACT

Electric power grid monitoring methods and apparatus are described. According to one aspect, an electric power grid signal processing method includes accessing a plurality of signals which are individually indicative of a characteristic of electromechanical energy within an electric power grid, using the plurality of signals, generating a composite signal, and analyzing the composite signal to provide information regarding an oscillatory mode within the electric power system.

21 Claims, 4 Drawing Sheets

(56) References Cited

OTHER PUBLICATIONS

Hauer et al., "Initial Results in Prony Analysis of Power System Response Signals", IEEE Transactions on Power Systems vol. 5, No. 1, Feb. 1990, United States, pp. 80-89.

Pierre et al., "Initial Results in Electromechanical Mode Identification for Ambient Data", IEEE Transactions on Power Systems vol. 12, No. 3, Aug. 1997, United States, pp. 1245-1251.

Trudnowski et al., "Signal Processing Methods for Estimating Small-Signal Dynamic Properties from Measured Responses", Chapter 1 of Inter-area Oscillations in Power Systems: A Nonlinear and Nonstationary Perspective, Springer, 2009, United States, pp. 1-36.

Trudnowski, "Estimating Electromechanical Mode Shape Form Synchrophasor Measurements", IEEE Transactions on Power Systems vol. 23, No. 3, Aug. 2008, United States, pp. 1188-1195.

Tuffner et al., "Weighted Update Method for Spectral Mode Shape Estimation from PMU Measurements", Proceedings of the IEEE Power Engineering Society General Meeting, Jul. 2010, United States, 8 pages.

Zhou et al., "Automatic Implementation of Prony Analysis for Electromechanical Mode Identification from Phasor Measurements", Proceedings of the IEEE Power Engineering Society General Meeting, Jul. 2010, United States, 8 pages.

Zhou et al., "Electromechanical Mode Shape Estimation Based on Transfer Function Identification Using PMU Measurement", IEEE Power & Energy Society General Meeting, Jul. 26-20, 2009, Calgary, Alberta, 7 pages.

\* cited by examiner

US 9,293,949 B2

ELECTRIC POWER GRID SIGNAL PROCESSING METHODS, OSCILLATORY MODE ESTIMATION METHODS AND MODE SHAPE ESTIMATION METHODS

TECHNICAL FIELD

This disclosure relates to electric power grid monitoring methods and apparatus.

BACKGROUND OF THE DISCLOSURE

Electromechanical oscillations occur within an interconnected synchronized electric power grid when two or more rotating machines (e.g., generators), perhaps at great geographical distance from one another, exchange energy. Oscillations are manifested within the electric power grid as dynamically changing power delivery patterns over the bulk electric transmission grid. Undamped or excessive oscillatory energy within an interconnected electric power grid can cause catastrophic failure of the grid resulting in widespread "blackouts." The frequencies, damping, shape, and magnitude of the oscillatory energy present within an interconnected electric power grid at any given time, regardless of whether the oscillations ultimately result in a blackout, are indicators of system stress. Accordingly, it is prudent and useful to monitor these parameters within an interconnected electric power grid.

The disclosure is directed towards apparatus and methods for monitoring electromechanical oscillations within an electric power grid.

BRIEF DESCRIPTION OF THE DRAWINGS

Exemplary embodiments of the disclosure are described below with reference to the following accompanying drawings.

DETAILED DESCRIPTION OF THE DISCLOSURE

This disclosure is submitted in furtherance of the constitutional purposes of the U.S. Patent Laws "to promote the progress of science and useful arts" (Article 1, Section 8).

According to one embodiment, an electric power grid signal processing method comprises accessing a plurality of signals which are individually indicative of a characteristic of electromechanical energy within an electric power grid, using the plurality of signals, generating a composite signal, and analyzing the composite signal to provide information regarding an oscillatory mode within the electric power system.

According to another embodiment, an oscillatory mode estimation method comprises processing a signal which is indicative of electromechanical energy within an electric power grid, analyzing the signal which is indicative of the electromechanical energy using an analysis function to estimate an oscillatory mode of interest upon the electric power grid, wherein the analyzing comprises analyzing in accordance with results of the processing of the signal.

According to an additional embodiment, a mode shape estimation method comprises identifying a frequency of an oscillatory mode of interest within an electric power grid and analyzing a signal which is indicative of electromechanical energy within the electric power grid using a mode shape estimation function in accordance with the frequency of the oscillatory mode of interest.

Figure 1:
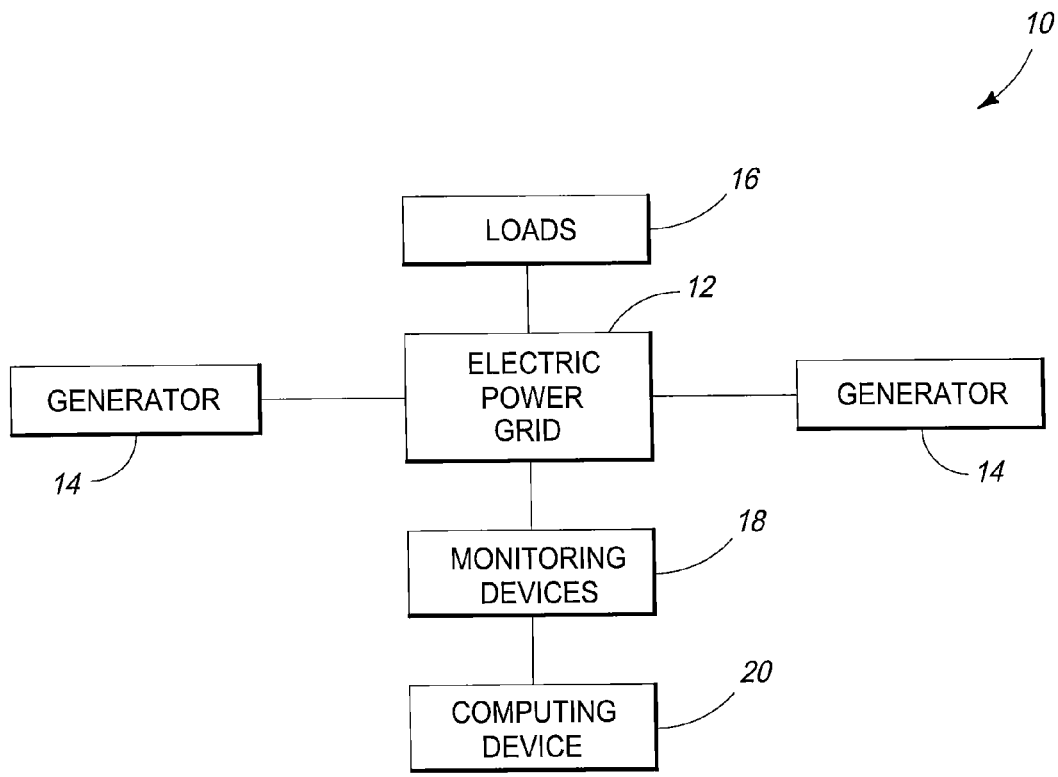
FIG. 1 is a functional block diagram of an electrical system according to one embodiment.

Referring to FIG. 1, an example block diagram of a synchronous electrical system 10 for delivering electric power is shown. The illustrated example system 10 includes an electric power grid 12 which transmits electric power from a plurality of generators 14 to consumer's loads 16 where the delivered electric power is consumed. An example electric power grid 12 may include transmission and distribution networks which transmit electric power over significant distances and at appropriate voltages for use by the loads 16. Although only two generators 14 are shown, numerous generators 14 may be generating and delivering electrical power to the electric power grid 12.

A plurality of monitoring devices 18 may monitor electric power flowing through a plurality of points or nodes of the electric power grid 12. For example, the monitoring devices 18 may be configured to monitor the electric power at substations, branching points and/or other desired locations of the electric power grid 12. In one embodiment, the monitoring devices 18 are implemented as phasor measurement units (PMUs) which may monitor and sample phasors of the electric power grid 12 in the form of magnitudes and phase angles of electrical characteristics, such as currents and voltages. Measurements of the monitoring devices 18 may be utilized to assist with the detection of potentially dangerous oscillatory modes which may occur within electric power grid 12, for example, when generators 14 or groups of generators 14 exchange energy, perhaps over significant geographical distances (e.g., thousands of miles).

Some analysis operations utilize samples from a plurality of monitoring devices 18 which may be synchronized in time, and accordingly, the monitoring devices 18 are configured to obtain at least some of the samples at common points in time in one embodiment. In one embodiment, the monitoring devices 18 may have internal clocks which are synchronized with respect to one another, for example, using a global positioning system (GPS).

Figure 2:
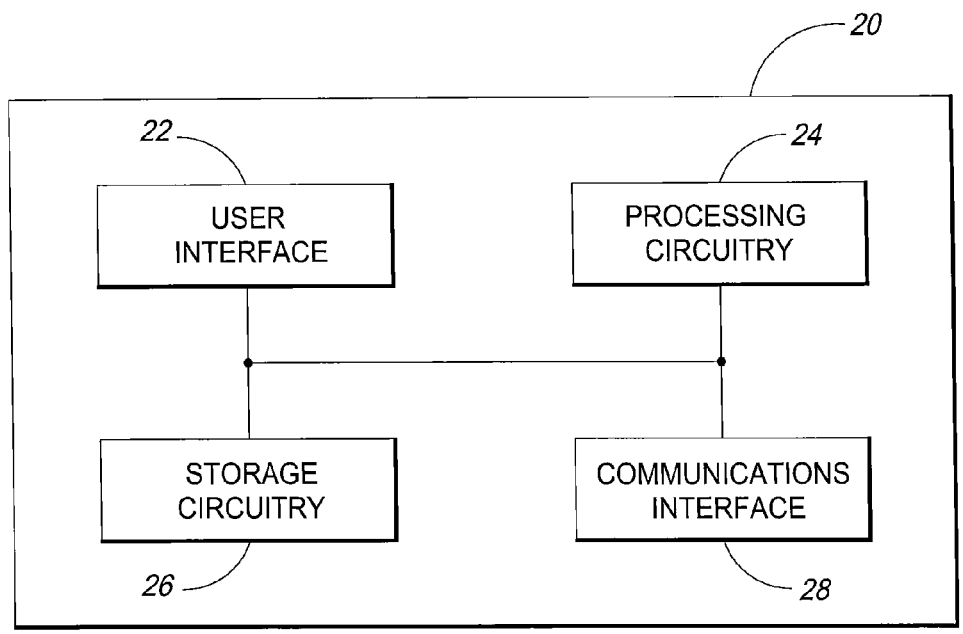
FIG. 2 is a functional block diagram of a computing device according to one embodiment.

A computing device 20 is coupled with the monitoring devices 18 and is configured to process signals generated by the monitoring devices 18 as described further below. For example, the computing device 20 may monitor the output of the monitoring devices 18 to identify the presence of potentially dangerous oscillatory energy upon the electric power grid 12. Referring to FIG. 2, one example embodiment of a computing device 20 is shown and includes a user interface 22, processing circuitry 24, storage circuitry 26 and a communications interface 28. Other embodiments of computing device 20 are possible including more, less, and/or alternative components.

User interface 22 is configured to interact with a user including conveying data to a user (e.g., displaying visual images for observation by the user) as well as receiving inputs from the user. User interface 22 may indicate operational conditions within the electrical system 10 and may display or indicate warnings, for example, upon the detection of potentially dangerous oscillatory modes which may be present within electric power grid 12.

In one embodiment, processing circuitry 24 is arranged to process data, control data access and storage, issue commands, and control other desired operations. For example, processing circuitry 24 may process signals from monitoring devices 18 as described in detail below.

Processing circuitry 24 may comprise circuitry configured to implement desired programming provided by appropriate computer-readable storage media in at least one embodiment. For example, the processing circuitry 24 may be implemented as one or more processor(s) and/or other structure configured to execute executable instructions including, for example, software and/or firmware instructions. Other exemplary embodiments of processing circuitry 24 include hardware logic, PGA, FPGA, ASIC, state machines, and/or other structures alone or in combination with one or more processor(s). These examples of processing circuitry 24 are for illustration and other configurations are possible.

Storage circuitry 26 is configured to store programming such as executable code or instructions (e.g., software and/or firmware), electronic data, databases, or other digital information and may include computer-readable storage media. At least some embodiments or aspects described herein may be implemented using programming stored within one or more computer-readable storage medium of storage circuitry 26 and configured to control appropriate processing circuitry 24.

The computer-readable storage medium may be embodied in one or more articles of manufacture which can contain, store, or maintain programming, data and/or digital information for use by or in connection with an instruction execution system including processing circuitry 24 in the exemplary embodiment. For example, exemplary computer-readable storage media may include any one of physical media such as electronic, magnetic, optical, electromagnetic, infrared or semiconductor media. Some more specific examples of computer-readable storage media include, but are not limited to, a portable magnetic computer diskette, such as a floppy diskette, a zip disk, a hard drive, random access memory, read only memory, flash memory, cache memory, and/or other configurations capable of storing programming, data, or other digital information.

Communications interface 28 is arranged to implement communications of computing system 10 with respect to external devices (such as monitoring devices 18). Furthermore, computing device 20 may also communicate with control facilities of the electric system 10, for example, such that corrective action may be implemented in the presence of potentially dangerous oscillatory modes within the electric power grid 12.

In one embodiment, communications interface 28 may be arranged to communicate information bi-directionally with respect to computing device 20. Communications interface 28 may be implemented as a network interface card (NIC), serial or parallel connection, USB port, Firewire interface, flash memory interface, or any other suitable arrangement for implementing communications with respect to computing device 20.

Figure 3:
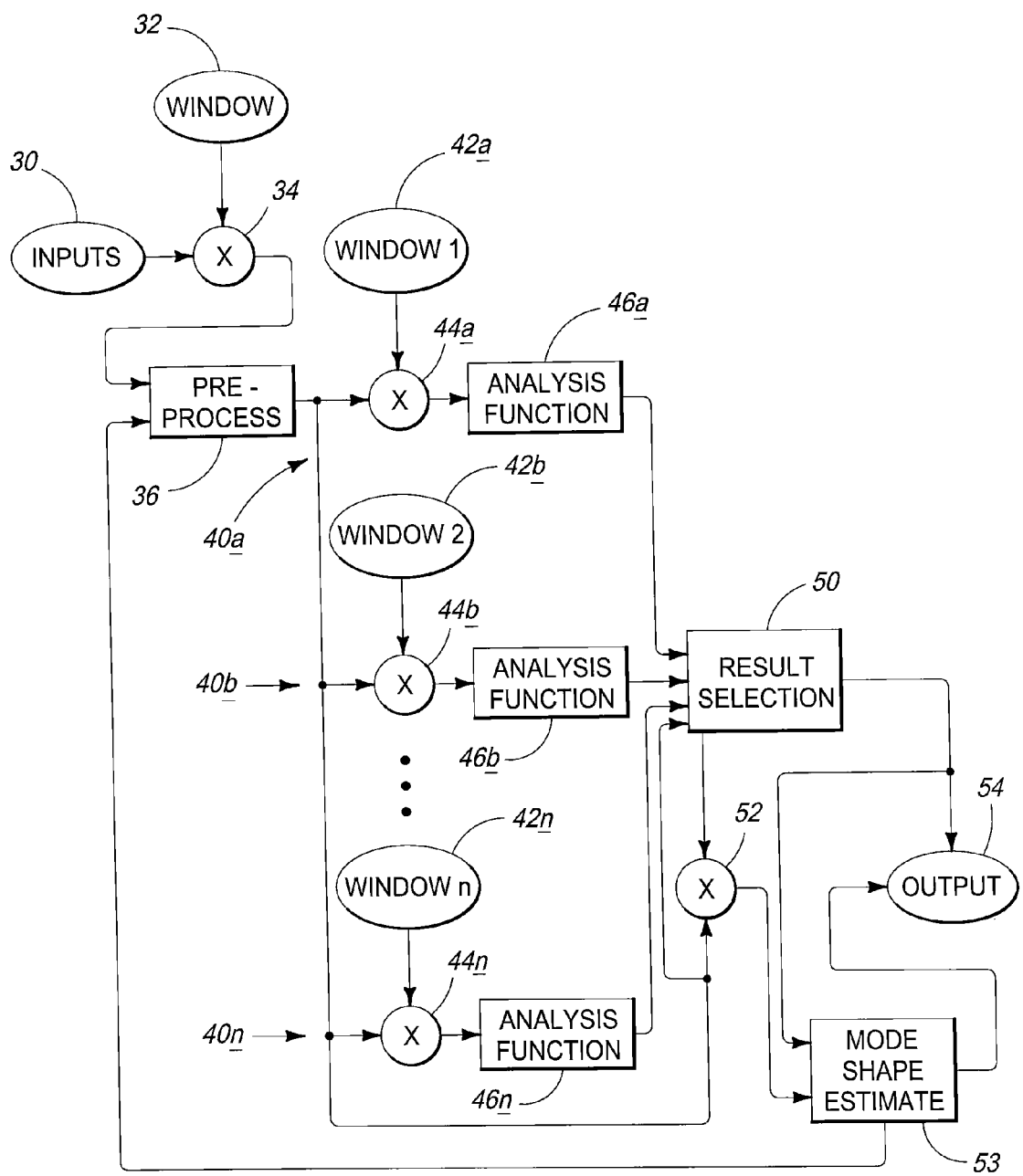
FIG. 3 is a functional block diagram of a method of monitoring oscillatory energy in the electrical system according to one embodiment.

Referring to FIG. 3, a plurality of processing operations performed by processing circuitry 24 of computing device 20 are described according to one embodiment. Additional details of processing operations of FIG. 3 are also shown in the example methods of FIGS. 4-5. Among performing other operations, the computing device 20 may process a plurality of data signals generated by a plurality of monitoring devices 18 for use in estimating oscillatory modes in terms of frequency, damping and shape in at least one embodiment.

As shown in the example of FIG. 3, computing device 20 is configured to access input 30 in the form of signals, also referred to as samples, generated by the monitoring devices 18 in one embodiment. A signal measured by a monitoring device 18 may be referred to as a "synchrophasor" which may include information regarding one or more characteristic of electromechanical energy of system 10 (e.g., a phasor voltage or current in real/imaginary or magnitude/angle format). The synchrophasors may include appropriate time stamps when they were obtained and reporting rates of the respective measuring devices 18 in one embodiment. The signals of input 30 may be accessed from monitoring devices 18 which are selected based upon an oscillatory mode of interest to be analyzed according to one embodiment.

One aspect of the disclosure is directed towards calculating one or more composite signals, which may be referred to as pseudosynchrophasor signals, that contain enhanced modal (or oscillatory) energy signatures and which may be used to provide estimates of a mode's frequency and damping within the electric power grid 12 of increased accuracy. The shape is not calculated for the composite signal. In one embodiment, a pseudosynchrophasor is a signal derived from combining and/or scaling multiple synchrophasor signals as described in additional detail below. In a more specific example, pseudosynchrophasor signals are generated by combining and/or scaling a plurality of synchrophasor signals, for example, which may include linearly combining signals having different voltage angles or linearly combining real or reactive power signals. In many electric power systems, a single synchrophasor signal may not contain sufficient information content upon which to perform subsequent analysis and which in turn may result in poor accuracy of modal estimates (e.g., estimation of damping of a mode of interest). The created pseudosynchrophasor signals may be processed using known techniques to provide modal estimates of increased accuracy over analysis operations which are based upon individual synchrophasor signals.

In the example of FIG. 3, the accessed signals of input 30 are initially processed 34 using a window 32. The window 32 selects a prescribed time history of the signals of input 30. For example, the past 10 seconds of the signals of input 30 are selected in one embodiment. Other window sizes may be used in other embodiments.

Figure 4:
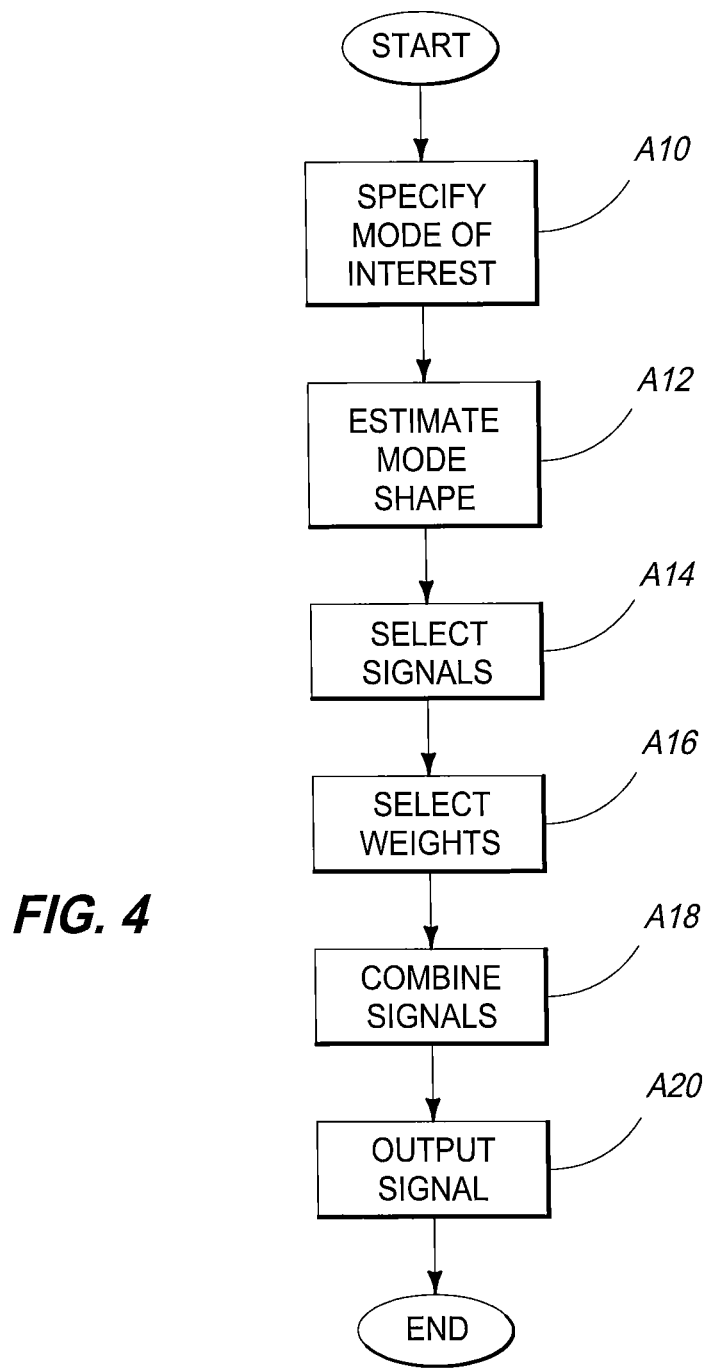
FIG. 4 is a flow chart of a method of generating a composite signal according to one embodiment.

The output is applied to preprocessing 36 where the signals may be combined to form a composite signal as described in additional detail in one embodiment in FIG. 4. The example preprocessing method of FIG. 4 calculates a composite signal for use in analyzing a mode of interest according to one aspect of the disclosure. The illustrated example method may be performed using the processing circuitry 24 in one embodiment. Other methods are possible including more, less and/or alternative acts.

At an act A10, a mode of interest at a particular frequency is identified. For example, a mode of interest may be identified using a spectrum estimation algorithm or from a previous iteration of the output 54. Using previous research, certain modes may be known to be susceptible to underdamping and may be monitored more closely than other modes. Furthermore, the generators which participate in the mode may be known, and accordingly, the synchrophasor signals utilized below may be selected from monitoring devices 18 which monitor such participating generators.

At an act A12, the mode shape of the identified mode of interest is estimated. The mode shape of the selected synchrophasor signals is estimated or alternatively a previous iteration estimate from mode shape estimation 53 may be used. Mode shape estimation analyzes the input signals and mode frequency as inputs from mode-meter functions of the selected monitoring devices 18 being analyzed and calculates the mode shape for the identified mode of interest.

The mode shape is estimated using signal processing algorithms, such as cross-spectrum analysis and transfer-function estimation methods in illustrative examples. The mode-shape for each synchrophasor signal is represented by a magnitude and angle in the described example. Example methods for estimating mode shape are described in D. Trudnowski and J. Pierre, "Signal Processing Methods for Estimating Small-Signal Dynamic Properties from Measured Responses," Chapter 1 of *Inter-area Oscillations in Power Systems: A Nonlinear and Nonstationary Perspective*, ISBN: 978-0-387-89529-1, Springer, 2009; D. Trudnowski, "Estimating Electromechanical Mode Shape from Synchrophasor Measurements," *IEEE Transactions on Power Systems*, vol. 23, no. 3, pp. 1188-1195, August 2008; L. Dosiek, J. Pierre, D. Trudnowski, and N. Zhou, "A Channel Matching Approach for Estimating Electromechanical Mode Shape and Coherence," *IEEE Power & Energy Society General Meeting*, paper no. 09GM0255, Calgary, Alberta, Jul. 26-30, 2009; N. Zhou, Z. Huang, L. Dosiek, D. Trudnowski, J. Pierre, "Electromechanical Mode Shape Estimation Based on Transfer Function Identification Using PMU Measurements," *IEEE Power & Energy Society General Meeting*, paper no. 09GM0342, Calgary, Alberta, Jul. 26-30, 2009; F. K. Tuffner, L. Dosiek, J. W. Pierre, and D. Trudnowski, "Weighted Update Method for Spectral Mode Shape Estimation from PMU Measurements," *Proceedings of the IEEE Power Engineering Society General Meeting*, July 2010; N. Zhou, Z. Huang, L. Dosiek, D. J. Trudnowski, and, J. W. Pierre, "Electromechanical Mode Shape Estimation Based on Transfer Function Identification Using PMU Measurements," *Proceedings of the IEEE Power Engineering Society General Meeting*, July 2009; L. Dosiek, J. W. Pierre, D. J. Trudnowski, and N. Zhou, "A Channel Matching Approach for Estimating Electromechanical Mode Shape and Coherence," *Proceedings of the IEEE Power Engineering Society General Meeting*, July 2009; L. Dosiek, D. J. Trudnowski, and J. W. Pierre, "New Algorithms for Mode Shape Estimation Using Measured Data," *Proceedings of the IEEE Power Engineering Society General Meeting*, July 2008; and L. Dosiek, "Estimating Power System Electromechanical Modes and Mode Shapes Using Modern System Identification Techniques," PhD thesis, University of Wyoming, 2010, the teachings of which are incorporated herein by reference.

At an act A14, a plurality of signals may be selected which are to be combined. The signals may be synchrophasor signals provided by the monitoring devices 18, and accordingly, indicative of voltages, currents, or other derived signals, such as power and frequency. In one embodiment, the signals are selected from monitoring devices 18 which sample signals from diverse geographical areas of the electric power grid 12, for example, from different nodes of the electric power grid 12. In one embodiment, the selected signals which are combined comprise data which are synchronized with one another with respect to time (e.g., data samples of the signals are synchronized with one another with respect to time). In one implementation, signals with a relatively large mode-shape amplitude are selected. For example, all signals with a mode-shape amplitude greater than a threshold may be selected. A threshold may be selected based upon engineering studies of historical data and/or benchmark testing of the power system in one embodiment. In another example, one might select a synchrophasor signal from a geographic region with the largest mode-shape amplitude. Additional details regarding selecting signals are described in D. Trudnowski, "Estimating Electromechanical Mode Shape from Synchrophasor Measurements," *IEEE Transactions on Power Systems*, vol. 23, no. 3, pp. 1188-1195, August 2008, the teachings of which are incorporated herein by reference.

At an act A16, weights are selected in the described method for weighting of the signals before they are combined. The weighting factors may be linear in one embodiment. In one embodiment, the weights are selected such that in-phase signals are additive during combination operations and anti-phase signals are subtractive providing an increased coherent gain. For example, a synchrophasor signal provided by a monitoring device 18 may include information regarding a plurality of modes. The weights may be selected such that the information in the signals regarding the mode of interest is increased when the signals are combined while information regarding other modes (not of interest or otherwise noise) is reduced or canceled.

In one more specific embodiment, weights are selected based upon mode-shape amplitudes and angles to amplify modal energy of a desired mode. For example, if the mode shape of synchrophasor 1 of interest is 180 degrees out of phase with the mode shape of synchrophasor 2 of interest, the weight for synchrophasor 1 will be the negative of the weight for synchrophasor 1. The synchrophasors are then linearly combined using the calculated weights. In another example, a weight may be selected as an inverse of a mode-shape amplitude of a signal (e.g., synchrophasor 1 may have a mode-shape amplitude of 0.1 with an angle of 0 degrees, and synchrophasor 2 may have mode-shape amplitude of 0.3 with an angle of 180 degrees and the weights would then be 1/0.1 for synchrophasor 1 and 1/0.3 for synchrophasor 2 in this example).

At an act A18, the signals are combined with the appropriate weightings to form the composite signal (e.g., pseudosynchrophasor signal), which has increased oscillatory energy content regarding the mode of interest and yielding a more accurate estimate of energy content for the mode of interest compared with an individual signal obtained from a single monitoring device 18. The pseudosynchrophasor is representative of oscillation energy (also referred to as modal energy) for the given mode of interest and is a time-series signal calculated from plural synchrophasor signals generated by a plurality of monitoring devices 18 which correspond to a mode of interest in the described embodiment. In one example, the signals are multiplied by the weights and the weighted signals are added.

At an act A20, the composite signal is output and may be used for further analysis of the mode of interest.

For example, the composite signal may be processed using one or more desired analytical techniques or functions to provide information regarding the oscillatory mode of interest (e.g., frequency, damping, shape). Example analytical techniques include a mode meter function, a ringdown detector function, an oscillation trigger function or a mode shape estimator function as described further below. The use of the generated composite signal typically requires less fine tuning of the analysis functions which are utilized and provides increased accuracy of the analysis functions over a wider range of parameters compared with executing the analysis functions upon synchrophasor signals without the described pre-processing.

Referring again to 4, the output of the preprocessing 36 (i.e., the composite signal) may be processed in parallel by plural processing operations 40*a*-40*n* using a plurality of respective different window sizes 42*a*-42*n* which correspond to different amounts of data of the signal in the described example method. The use of plural processing operations 40a-40n upon the different window sizes 42a-42n is implemented to attempt to identify a reduced amount of information which may be processed while still enabling satisfactory results to be obtained.

For example, if the analysis utilizes too much data, potentially damaging oscillations may not be identified in sufficient time to permit corrective action to be taken. Accordingly, the use of a smaller window size may improve a response time as well as increase the chances that changes of short duration corresponding to a potentially dangerous mode may be identified. However, the results may be inaccurate if insufficient data is utilized. As described further below, the composite signal may be processed separately to determine which of the window sizes 42a-42n should be utilized to provide improved (faster) response times while still yielding acceptable results. While the present embodiment is discussed with respect to parallel processing of a composite signal, the parallel processing may also be performed upon other signals, such as synchrophasors.

The illustrated processing operations multiply 44a-44n the composite signal by the appropriate data window size (e.g., appropriate time history of data to be utilized) 42a-42n to provide the different amounts of data which will be processed by the respective analysis function 46a-46n corresponding to the respective window sizes 42a-42n. Example window sizes 42a-42n may be selected between an example range of 10 seconds-60 minutes for ringdown detection, oscillation trigger and mode meter processing described below. Additional window sizes may also be utilized and/or different window sizes may be utilized corresponding to the analyses to be performed. In one embodiment, the different processing operations 40a-40n operate upon data from the present moment in time and going back in time as determined by the respective window size 42a-42n for the respective processing operation 40a-40n.

One example of an analysis function 46a-46n for monitoring oscillatory energy is called a mode meter function. A mode meter function is an automated analysis approach which uses input signals to calculate a given mode's frequency and damping under both ambient and transient conditions. This method typically takes 2 min to 60 min of data. Examples of mode meter functions which may be utilized include Yule-Walker, Robust Recursive Least Squares (RRLS), and Regularize RRLS (R3LS), are described in D. Trudnowski and J. W. Pierre, "Signal Processing Methods for Estimating Small-Signal Dynamics Properties from Measured Responses," Chapter 1 of *Inter-area Oscillation in Power Systems: A non-linear and Nonstationary Perspective*, Chapter 1, pp. 1-36, Springer, New York, 2009, the teachings of which are incorporated herein by reference.

Another example of an analysis function 46a-46n for monitoring oscillatory energy is called a ringdown detection function. A ringdown detection function analyzes an input signal, detects an oscillation, and estimates the modes (frequencies and respective dampings) contained in the transient. Parameters estimated are the damping, frequency, and shape of each mode in the transient. This approach typically utilizes approximately 30 sec. of data. Details of example ring detection functions are described in D. Trudnowski and J. Pierre, "Signal Processing Methods for Estimating Small-Signal Dynamic Properties from Measured Responses," Chapter 1 of *Inter-area Oscillations in Power Systems: A Nonlinear and Nonstationary Perspective*, ISBN: 978-0-387-89529-1, Springer, 2009 and N. Zhou, Z. Huang, F. Tuffner, J. W. Pierre, and S. Jin, "Automatic Implementation of Prony Analysis for Electromechanical Mode Identification from Phasor Measurements," *Proceedings of the IEEE Power Engineering Society General Meeting*, July 2010, the teachings of which are incorporated herein by reference.

Another example of an analysis function 46a-46n for monitoring oscillatory energy is called an oscillation trigger function. An oscillation trigger function is an algorithm that uses information from power spectral density calculations, possibly a mode meter, possibly oscillation detection calculations, and filtered time-domain signals to detect unusual oscillatory activity and provides notification of the oscillatory activity to a visualization application for presentation to an operator, engineer or other desired personnel. An example of an oscillation trigger function is described in J. Hauer and F. Vakili, "An Oscillation Detector used in the BPA Power System Disturbance Monitor," *IEEE Trans. On Power Systems*, vol. 5, no. 1, pp. 74-79, February 1990, the teachings of which are incorporated herein by reference. Other analysis functions may be also be utilized.

The outputs of the analysis functions 46a-46n are provided to results selection processing 50. Processing 50 also receives the composite signal outputted from preprocessing 36 and which may be processed to perform the selection in the described embodiment. In one embodiment, an amount of modal energy present in the range of the mode frequency of interest and the damping may be used to determine an appropriate window size. For example, if there is a certain amount of modal energy present, then a corresponding window size may be selected as determined by previous experiments and analysis of modes. In another example, if the damping is known to be a certain amount, then a window size which corresponds to the damping may be used as determined by previous experiments and analysis of modes. Accordingly, the composite signal may be processed as described with respect to FIG. 5 in one embodiment and the results of the processing of the composite signal may be utilized to determine the appropriate window size of data to be processed by the analysis function.

Figure 5:
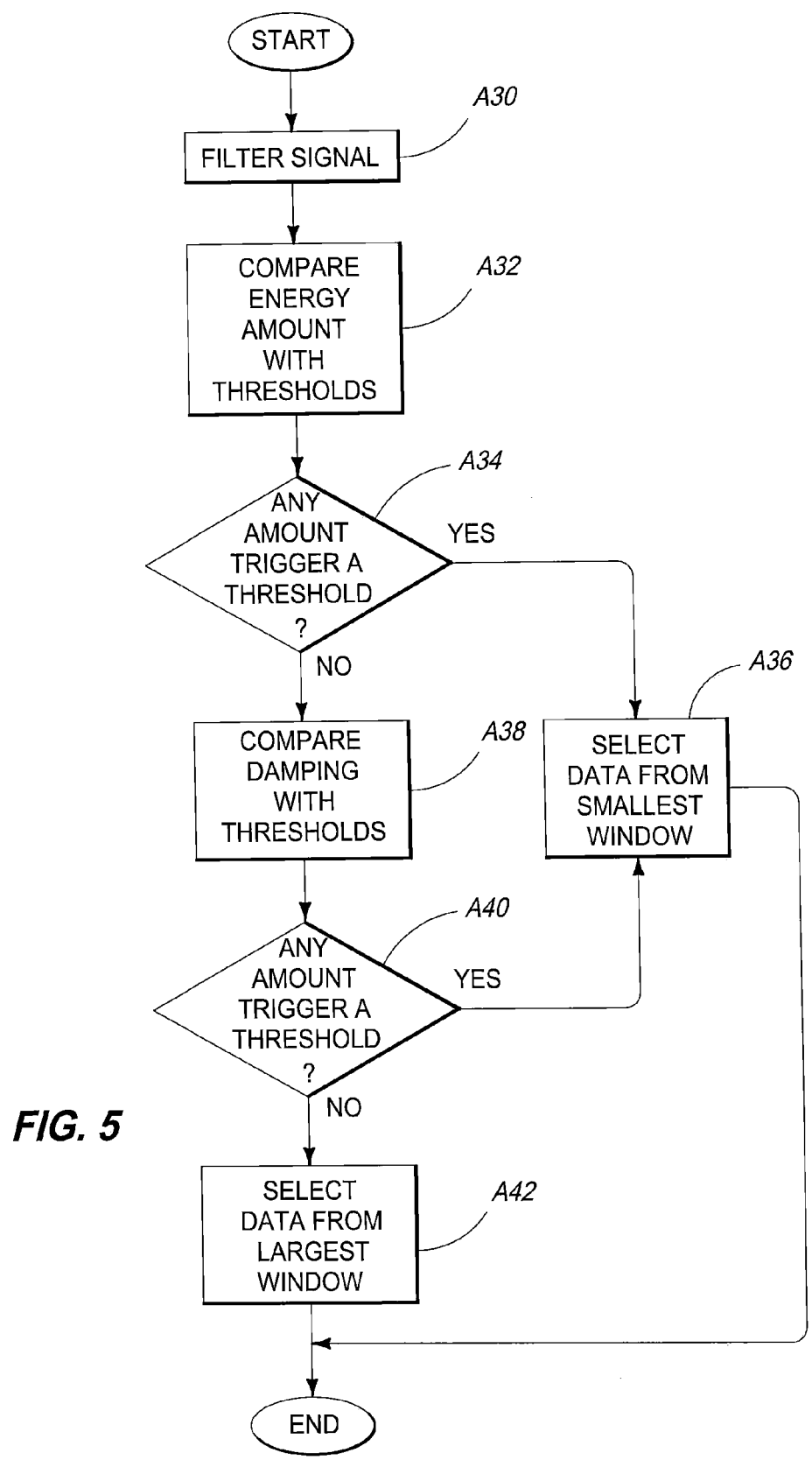
FIG. 5 is a flow chart of a method of selecting an appropriate window size of data to monitor oscillatory energy according to one embodiment.

Referring to FIG. 5, an example method performed during the results selection processing 50 of FIG. 4 to select an appropriate window size is described. The illustrated example method may be performed using the processing circuitry 24 in one embodiment. The illustrated method is described with respect to processing of a signal which is indicative of oscillatory energy in a mode of interest (e.g., the composite signal outputted from preprocessing 36, however, other signals such as a synchrophasor signal may also be processed in other embodiments). Other methods are possible including more, less and/or alternative acts.

At an act A30, the signal is filtered to identify an amount of oscillation energy present in the signal. In one embodiment, an RMS filter is used. The filtering provides information regarding the amount of energy present in the received signal corresponding to the range of the mode frequency of interest. In general, a relatively less amount of data may be processed for a desired accuracy if there is a relatively increased amount of energy present in the oscillation energy being analyzed in one embodiment. An RMS filter which may be used performs band-pass filtering in the range of the desired frequency, squaring the result of the band-pass filtered output, low-pass filtering the squared signal and calculating the square-root of the resulting low-pass filtered signal. The resulting output is a measure of the RMS energy of the original signal. In another embodiment, the squaring may be performed upon an absolute value of the result of the band-pass filtered output.

At an act A32, the amount of energy present may be compared with respect to one or more energy thresholds corresponding to energy levels within the signal. In one embodiment, a plurality of energy thresholds may be used corresponding to the respective window sizes which may be utilized (e.g., the triggering of one threshold results in the selection of a respective window size). Energy thresholds are selected based upon engineering studies of historical data and/or benchmark testing of the power system in one example.

At an act A34, it is determined whether the amount of oscillatory energy present as determined from act A30 triggered (e.g., is greater than) any of the energy thresholds.

If the result of act A34 is positive, then the processing proceeds to act A36 to select the appropriate window size of the data to be utilized. For example, if the greatest energy threshold which is indicative of the highest amount of energy being present is triggered, then the smallest window size may be utilized. If the next largest energy threshold is triggered, then the next smallest window size may be utilized. This comparison results in the selection of the smallest window size which corresponds to the highest threshold of the oscillatory energy being triggered.

If the result of act A34 is negative, then the processing proceeds to an act A38 to analyze the damping estimated in analysis function processing 46 with respect to a plurality of damping thresholds which also correspond to the respective window sizes. A relatively less amount of data may be processed for a desired accuracy if there is a relatively decreased amount of damping present in the oscillation energy being analyzed in one embodiment. Damping thresholds are selected based upon engineering studies of historical data and/or benchmark testing of the power system in one example.

At an act A40, it is determined whether the damping present triggered (e.g., is less than) any of the damping thresholds.

If the result of act A40 is positive, then the processing proceeds to act A36 to select the appropriate window size of the data to be utilized. For example, if the smallest damping threshold which is indicative of the least damping being present is triggered, then the smallest window size may be utilized. If the next smallest damping threshold is triggered, then the next smallest window size may be utilized. This comparison results in the selection of the smallest window size which corresponds to the smallest threshold of the damping being triggered.

If the result of act A40 is negative, then the processing proceeds to an act A42 where the largest window (e.g., default window size) and corresponding amount of data is utilized to provide the estimation of the mode. A relatively less amount of data may be processed for a desired accuracy if there is a relatively smaller amount of damping present in the oscillation energy being analyzed in one embodiment as mentioned above.

The process of FIG. 5 may be continuously performed, and accordingly different window sizes of data of the signal may be selected at different times for use in monitoring the oscillation energy of the signal and corresponding to the information present in the signal at the different moments in time.

The window size of data which is processed may be referred to as a parameter of the analysis function. As discussed above according to one embodiment, a plurality of values (e.g., 10 sec.-60 min.) of the parameter may be provided, and one of the values may be selected corresponding to the content of the signal (e.g., amount of energy present or damping as discussed above).

The appropriate estimation of the mode (e.g., frequency and damping) may be determined from the respective processing operations 40a-40n as selected by the results selection processing 50 described above in one embodiment. In another embodiment, only a single processing operation 40 may be performed following the identification of the appropriate window size without having to estimate the mode a plurality of times as described in the example of FIG. 3.

The utilization of different amounts of data in the analysis function improves the response time and consistency of the analysis function while maintaining a desired level of accuracy compared with other approaches which typically have overly slow response times to changing mode conditions. At different moments in time, the computing device may estimate the modes differently based upon the content of the oscillation signal at the different moments in time to provide improved response times (e.g., faster compared with other static approaches) while maintaining a desired level of accuracy.

As discussed above in the above-described example embodiment, modal energy at a modal frequency of interest and damping may be analyzed during the result selection processing 50 to determine whether a window size of data less than a default window size may be utilized. The above-mentioned example embodiment analyzes filtered data and an RMS indicator to determine modal energy at a modal frequency of interest. Other analysis operations may be used in other embodiments. For example, result selection processing 50 may examine modal energy content using a power spectral density technique, an oscillation trigger technique, a ring-down detector technique, or a FFT technique. In addition, the result selection processing 50 may also utilize information regarding whether the system was being exposed to active probing during the analysis period to determine the appropriate estimate of the mode to be used. Furthermore, the result selection processing 50 may also choose a mode meter analysis algorithm which best matches a current condition of the grid in one embodiment, for example, based upon whether or not probing is occurring or not.

The estimation of the oscillatory mode (e.g., frequency and damping) may be output 54 following the selection of the appropriate estimation of the oscillatory mode. As also shown in FIG. 3, the size of the window selected in the result selection 50 is applied at processing 52 to the time-series data being passed to mode shape estimation 53. For example, if result selection processing 50 selected a 10-minute window, the processing 52 uses a 10-minute window.

The output of processing 52 as well as the output of the result selection 50 are provided to mode shape estimation processing 53. Mode shape processing 53 may improve the accuracy of the mode shape estimated in FIG. 4 (and which estimation may also be utilized in subsequent executions of FIG. 4 with respect to the mode of interest). The estimation of the mode shape provides information (e.g., phases) regarding the generators which may be participating in the mode and may be adjusted if there is a need to take corrective action (e.g., reduce or increase power generation) to mitigate a dangerous mode, such as an underdamped mode. Improving the accuracy of the mode shape may provide increased information with respect to identification of the specific generators which are participating within a mode compared with less refined mode shape information which may only identify a region of the electric power grid which contains the participating generator(s) as well as other generator(s) which are not participating in the mode. The determined mode shape may assist operators with taking proper action with respect to specific individual generators to reduce potentially dangerous modes.

The mode shape may be estimated using auto and cross-spectral calculations of a plurality of synchrophasor signals or cross transfer function estimations of a plurality of synchrophasor signals. After the auto/cross spectrums or transfer functions are calculated, they may be evaluated at the mode frequency. Additional details regarding calculating mode shape are discussed in D. J. Trudnowski, "Estimating electromechanical mode shape from synchrophasor measurements," *IEEE Transactions on Power Systems*, vol. 23, no. 3, pp. 1188-1195, August 2008; L. Dosiek, J. W. Pierre, D. J. Trudnowski, and N. Zhou, "A channel matching approach for estimating electromechanical mode shape and coherence," in *Proceedings of the 2009 IEEE PES General Meeting*, Calgary, AB, Canada, July 2009; N. Zhou, L. Dosiek, D. Trudnowski, and J. W. Pierre, "Electromechanical mode shape estimation based on transfer function identification using PMU measurements," in *Proceedings of the 2009 IEEE PES General Meeting*, Calgary, AB, Canada, July 2009; and F. K. Tuffner, L. Dosiek, J. W. Pierre, and D. Trudnowski, "Weighted update method for spectral mode shape estimation from PMU measurements," in *Proceedings of the 2010 IEEE PES General Meeting*, Minneapolis, Minn., July 2010, the teachings of which are incorporated herein by reference. However, these techniques may become computationally burdensome for real-time automated applications if estimations of mode shape of a plurality of locations of monitoring devices 18 are to be performed.

According to one embodiment, a method is disclosed which provides an estimation of the mode shape without performing cross/auto spectrum processing of the full frequency spectrum. In this described example, the spectrum is not calculated at the full spectrum but rather at frequency bin(s) closest to the frequency of the mode of interest determined by the selected analysis function 46a-n. For example, result selection 50 selects a mode at 0.2722 Hz and the frequency resolution of the discrete Fourier calculation is 0.01 Hz, then the auto/cross spectrums are calculated at 0.27 Hz and 0.28 Hz and averaged using a weighting to bias to 0.2722 Hz.

In example embodiments, a sliding-window (e.g., 4-5 minutes of data) single-bin Discrete Fourier Transform (DFT) technique or a weighted averaged single-bin DFT technique with a forgetting factor may be utilized. A single-bin DFT may be computed using a direct DFT calculation, the Goertzel algorithm or a Chirp-z transform in example embodiments.

In one embodiment, the mode shape is continuously calculated (e.g., every five seconds) using updated information from the appropriate analysis functions 46a-n. Furthermore, the modal frequency of interest may also change during different estimates of the mode shape according to the output of the result selection processing 50 which results in the processing of the signal at different frequencies of interest at different moments in time. While the present embodiment is discussed with respect to use of a composite signal to calculate mode shape, the mode shape calculations may also be performed upon other signals, such as synchrophasors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A computer implemented electric power grid signal processing method comprising:
    identifying an oscillatory mode of interest within an electric power grid to be estimated from a plurality of other oscillatory modes;
    selecting a plurality of signals which are individually indicative of a characteristic of electromechanical energy within the electric power grid;
    using the identified oscillatory mode of interest, selecting a plurality of weights;
    using the selected weights, weighting the signals;
    combining the signals after the weighting to generate a composite signal having increased oscillatory energy content regarding the oscillatory mode of interest compared with individual ones of the signals;
    analyzing the composite signal to estimate parameters of the oscillatory mode of interest within the electric power grid; and
    providing the estimated parameters of the oscillatory mode of interest to an operator of the electric power grid and which are useable by the operator to adjust generation of electricity which is provided to the electrical power grid.

2. The method of claim 1 further comprising accessing the signals which are indicative of the characteristic of electromechanical energy from different geographical locations of the electric power grid.

3. The method of claim 1 wherein the generating comprises generating the composite signal using data within the signals which is synchronized with respect to time.

4. The method of claim 1 wherein the selecting comprises selecting the signals using the oscillatory mode of interest.

5. The method of claim 4 wherein the oscillatory mode is a first oscillatory mode of interest and the signals are a first set of signals, and further comprising:
    identifying a second oscillatory mode of interest to be estimated; and
    selecting a second set of signals using the second oscillatory mode of interest to be estimated, and wherein the first and second sets of signals are different.

6. A computer implemented oscillatory mode estimation method comprising:
    identifying an oscillatory mode of interest within an electric power grid to be estimated from a plurality of other oscillatory modes;
    processing a composite signal which is indicative of electromechanical energy within the oscillatory mode of interest within an electric power grid;
    wherein the processing includes, using a frequency of the oscillatory mode of interest, filtering the composite signal to provide information regarding the electromechanical energy present within the composite signal corresponding to the oscillatory mode of interest;

after the filtering, using the information regarding the electromechanical energy present within the composite signal corresponding to the oscillatory mode of interest to select one of a plurality of different window sizes of different amounts of data of the composite signal to be processed using an analysis function;

analyzing data of the composite signal corresponding to the one of the different window sizes using the analysis function to estimate parameters of the oscillatory mode of interest within the electric power grid; and providing the estimated parameters of the oscillatory mode of interest to an operator of the electric power grid and which are useable by the operator to adjust generation of electricity which is provided to the electrical power grid.

7. The method of claim 6 wherein the information regarding the electromechanical energy present within the composite signal corresponding to the oscillatory mode of interest is used to select the one window size which specifies use of the least amount of data of the signal.

8. The method of claim 6 wherein the analyzing comprises analyzing the data of the composite signal a plurality of times using the different window sizes to provide different estimates of the parameters of the oscillatory mode of interest before the selecting.

9. The method of claim 6 wherein the analyzing comprises analyzing the data of the composite signal using the analysis function in parallel using the different window sizes.

10. The method of claim 6 further comprising combining a plurality of signals which are individually indicative of a characteristic of electromechanical energy within the electric power grid to generate the composite signal.

11. The method of claim 6 wherein the information regarding the electromechanical energy present within the composite signal corresponding to the oscillatory mode of interest comprises information regarding an amount of electromechanical energy present within the signal which corresponds to the oscillatory mode of interest, and wherein the amount of electromechanical energy present within the composite signal is used to select the one window size.

12. The method of claim 6 wherein the information regarding the electromechanical energy present within the composite signal corresponding to the oscillatory mode of interest comprises information regarding an amount of damping of the oscillatory mode of interest, and wherein the amount of damping present within the composite signal is used to select the one window size.

13. The method of claim 6 wherein the information regarding the electromechanical energy present within the composite signal corresponding to the oscillatory mode of interest is used to select the analysis function which is used to analyze the data of the composite signal from a plurality of other analysis functions.

14. The method of claim 6 wherein the information regarding the electromechanical energy present within the composite signal corresponding to the oscillatory mode of interest comprises information regarding an amount of energy of the oscillatory mode of interest.

15. The method of claim 6 wherein the information regarding the electromechanical energy present within the composite signal corresponding to the oscillatory mode of interest comprises information regarding damping of the oscillatory mode of interest.

16. A computer implemented mode shape estimation method comprising:

identifying an oscillatory mode of interest within an electric power grid to be estimated from a plurality of other oscillatory modes;

identifying a single frequency of the oscillatory mode of interest;

selecting a plurality of signals which are indicative of electromechanical energy within the electric power grid and correspond to the single frequency of the oscillatory mode of interest;

analyzing the selected signals using a mode shape estimation function to estimate a mode shape of the oscillatory mode of interest;

providing information regarding the mode shape of the oscillatory mode of interest as a result of the analyzing; and providing the information regarding the mode shape of the oscillatory mode of interest to an operator of the electric power grid and which is useable by the operator to adjust generation of electricity which is provided to the electrical power grid.

17. The method of claim 16 wherein the analyzing comprises only analyzing the selected signals using the mode shape estimation function at the single frequency of the oscillatory mode of interest and not analyzing the selected signals at other frequencies.

18. The method of claim 16 further comprising:

defining a plurality of frequency bins of a frequency spectrum; and selecting one or more of the frequency bins corresponding to the single frequency of the oscillatory mode of interest, and wherein the analyzing comprises analyzing the selected signals using the mode shape estimation function at the one or more of the selected frequency bins.

19. The method of claim 16 wherein the analyzing identifies a phase of a generator which participates in the oscillatory mode of interest.

20. The method of claim 16 wherein the analyzing comprises performing spectral calculations using the selected signals which are synchrophasor signals.

21. The method of claim 16 further comprising generating a composite signal from a plurality of synchrophasor signals, and wherein the identifying the single frequency comprises processing the composite signal to identify the single frequency of the oscillatory mode of interest.

* * * * *